United States Patent [19]
Johannsmeier

[11] 3,858,978
[45] Jan. 7, 1975

[54] CHUCK FOR USE IN OUT-OF-CONTACT OPTICAL ALIGNMENT AND EXPOSURE APPARATUS

[75] Inventor: Karl-Heinz Johannsmeier, Mountain View, Calif.

[73] Assignee: Kasper Instruments, Inc., Mountain View, Calif.

[22] Filed: Aug. 10, 1973

[21] Appl. No.: 387,489

[52] U.S. Cl. .......... 355/79, 279/4, 355/95
[51] Int. Cl. .......... G03b 27/02
[58] Field of Search .......... 355/78, 79, 92, 95; 279/1 L, 4, 16

[56] References Cited

UNITED STATES PATENTS

| | | | |
|---|---|---|---|
| 3,220,331 | 11/1965 | Evans et al. | 355/78 |
| 3,490,846 | 1/1970 | Kasper | 355/78 |
| 3,674,368 | 7/1972 | Johannsmeier | 355/78 |

*Primary Examiner*—Richard A. Wintercorn
*Attorney, Agent, or Firm*—Roland I. Griffin

[57] ABSTRACT

A calibrator plate is retractably mounted between a mask holder and a wafer chuck, which is in turn pivotally mounted below the mask holder on a piston for axially moving the wafer chuck towards and away from the mask holder. The wafer chuck includes a peripheral portion and a central portion that may be axially depressed relative to the upper surface of the peripheral portion and that may thereafter be returned to its normal undepressed position. These portions of the wafer chuck and corresponding offset portions of the calibrator plate are employed to space the upper surface of a semiconductive wafer on the central portion of the wafer chuck a finite distance below the upper surface of the peripheral portion of the wafer chuck. The calibrator plate is then retracted from between the mask holder and the wafer chuck, which is thereupon driven upward to position the upper surface of the peripheral portion of the wafer chuck in abutment upon a marginal portion of the lower surface of a photomask held by the mask holder. This aligns the lower surface of the photomask and the upper surface of the semiconductive wafer in parallel planes spaced the finite distance apart without bringing the semiconductive wafer into contact with the photomask.

10 Claims, 3 Drawing Figures

CHUCK FOR USE IN OUT-OF-CONTACT OPTICAL ALIGNMENT AND EXPOSURE APPARATUS

BACKGROUND AND SUMMARY OF THE INVENTION

This invention relates generally to apparatus for aligning a semiconductive wafer with a photomask and thereafter exposing a photosensitive film on a surface of the semiconductive wafer through the photomask. It relates, more particularly, to an improved wafer chuck that may be employed with a calibrator plate to align a pattern-bearing surface of the photomask and the photosensitive-film-bearing surface of the semiconductive wafer in closely spaced parallel planes without bringing the semicondutive wafer into contact with the photomask.

In most conventional optical alignment and exposure instruments for transferring a geometric pattern of a photomask to a semiconductive wafer, a photosensitive-film-bearing upper surface of the semiconductive wafer and a pattern-bearing lower surface of the photomask are initially brought into intimate contact to establish parallel-plane alignment therebetween. The semiconductive wafer and the photomask are then separated to permit out-of-contact alignment of a pattern on the photosensitive-film-bearing upper surface of the semiconductive wafer with the pattern of the photomask. After this pattern-alignment operation, the photosensitive film-bearing upper surface of the semiconductive wafer and the pattern-bearing lower surface of the photomask are again brought into intimate contact while the photosensitive film is exposed through the photomask. Optical alignment and exposure instruments of this type are shown and described, for example, in U.S. Pat. No. 3,192,844 issued July 6, 1965, to Peter R. Szaz et al and in U.S. Pat. No. 3,220,231 issued Nov. 30, 1965, to James A. Evans et al. The mechanical abrasion inevitably produced between the photosensitive-film-bearing upper surface of the semiconductive wafer and the pattern-bearing lower surface of the photomask by such alignment and exposure instruments, particularly during the parallel-plane alignment of these surfaces, may damage one or both of these surfaces and, in any event, unduly wears the pattern-bearing surface of the photomask. Damaged or scratched areas on the pattern-bearing surface of the photomask are especially undesirable since they will be reproduced on all semiconductive wafers with which the photomask is subsequently used.

In order to minimize or eliminate the foregoing problems, optical alignment and exposure instruments have been developed in which the parallel-plane-alignment and exposure operations are performed without bringing the semiconductive wafer into contact with the photomask. Optical alignment and exposure instruments of this type are shown and described, for example, in U.S. Pat. No. 3,674,368 issued July 4, 1972, to Karl-Heinz Johannsmeier. In the first such instrument shown and described in detail in that patent, a calibrator plate and a wafer chuck with a locking ring structure that may be retractably elevated above the upper surface of a semiconductive wafer on the wafer chuck are employed to space the upper surface of the locking ring structure a finite distance above the upper surface of the semiconductive wafer. The wafer chuck is then driven upward to position the upper surface of the locking ring structure in abutment upon a marginal portion of the lower surface of the photomask and thereby align the upper surface of the semiconductive wafer and the lower surface of the photomask in spaced parallel planes.

One disadvantage of the last-mentioned optical alignment and exposure system is that the locking ring structure of the wafer chuck employed therein requires some rather expensive parts and critical seals and is difficult to fabricate, control, and maintain. Accordingly, it is the principal object of this invention to provide an improved wafer chuck that may be employed therein, that eliminates the locking ring structure and the critical seals associated therewith, and that requires less expensive parts and is easier to fabricate, control, and maintain.

This object is accomplished according to the preferred embodiment of this invention by employing a wafer chuck including a base member pivotally mounted on a piston; a vacuum chuck plate coaxially positioned within a recessed central portion of the base member for axial movement therein relative to the upper surface of a peripheral outer portion of the base member; and an annular spring member coaxially secured to the vacuum chuck plate and frictionally engaged with the base member to limit the vacuum chuck plate to vertical axial movement within the recessed central portion of the base member and to maintain the vacuum chuck plate in any position to which it is axially moved therein. A plurality of stop members are attached to the vacuum chuck plate and engaged with the base member to limit upward vertical movement of the vacuum chuck plate to a normal wafer loading and unloading position at which the upper surfaces of the vacuum chuck plate and the peripheral outer portion of the base member lie in the same plane. Air pressure is supplied through a conduit in the base member to a region enclosed between the recessed central portion of the base member and the vacuum chuck plate to return the vacuum chuck plate to its normal wafer loading and unloading position from any position to which it may be depressed relative to the upper surface of the peripheral outer portion of the base member.

In operation, a semiconductive wafer is loaded onto the vacuum chuck plate when the vacuum chuck plate is in its normal wafer loading and unloading position, and the calibrator plate is positioned between the wafer chuck and the mask holder. The wafer chuck is then driven upward by the piston to position a marginal portion of the upper surface of the semiconductive wafer in abutment upon a first portion of the calibrator plate, to depress the vacuum chuck plate and the semiconductive wafer thereon relative to the upper surface of the peripheral outer portion of the base member, and to position the upper surface of the peripheral outer portion of the base member in abutment upon an inwardly offset second portion of the calibrator plate. This pivots the wafer chuck as required to align the upper surface of the semiconductive wafer and the upper surface of the peripheral outer portion of the base member in closely spaced parallel planes. The wafer chuck is then lowered, the calibrator plate retracted from between the lowered wafer chuck and the mask holder, and the wafer chuck driven upward again by the piston to position the upper surface of the peripheral outer portion of the base member in abutment upon a marginal portion of the lower surface of a photomask held by the mask holder. This pivots the wafer chuck as required to align the upper surface of the semiconductive wafer and the lower surface of the photomask in closely spaced parallel planes without bringing the semiconductive wafer into contact with the mask. The wafer chuck is then lowered slightly to permit out-of-contact alignment of a pattern on the upper surface of the semiconductive wafer with a pattern on the lower surface of the mask, after which the wafer chuck is again driven upward by the piston to reposition the upper surface of the semiconductive wafer and the lower surface of the photomask in closely spaced parallel planes in preparation for the exposure operation.

DESCRIPTION OF THE PREFERRED EMBODIMENT

Figure 1:
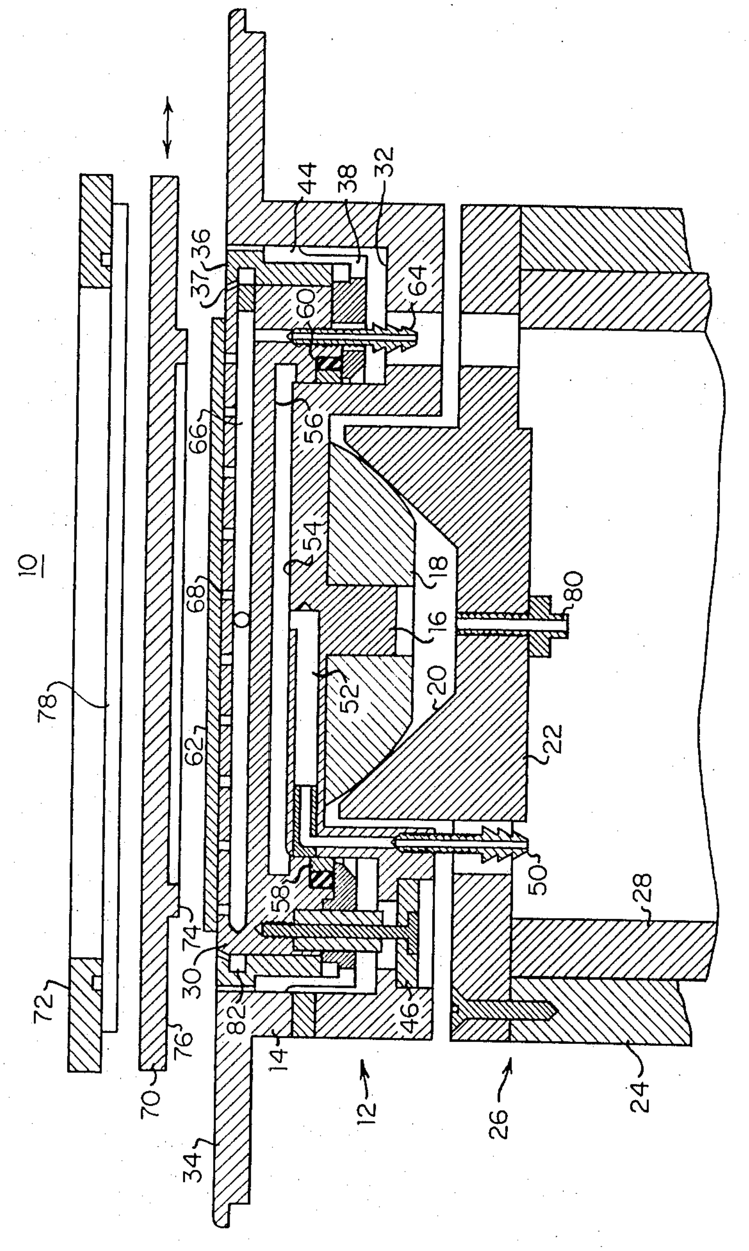
FIG. 1 is a half-sectional elevational view of optical alignment and exposure apparatus employing a wafer chuck according to the preferred embodiment of this invetnion and illustrating the normal wafer loading and unloading position of the wafer chuck.
Figure 2:
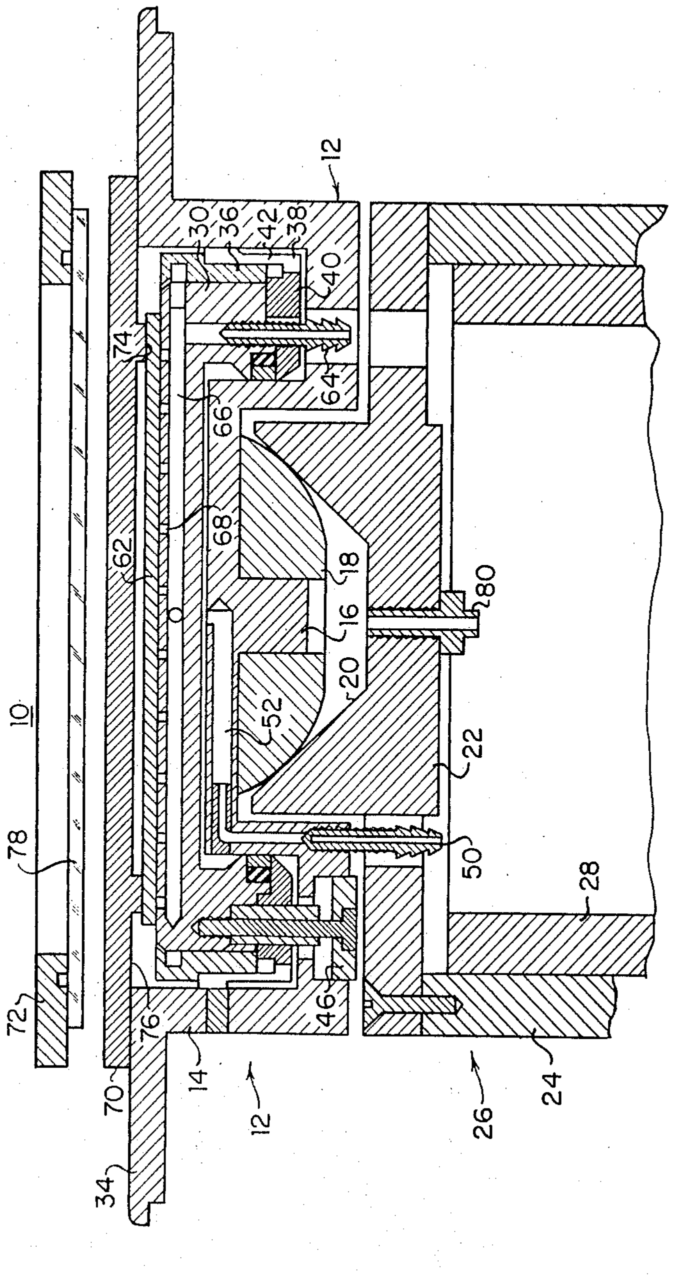
FIG. 2 is another half-sectional elevational view of the optical alignment and exposure apparatus of FIG. 1 illustrating the calibration position of the wafer chuck.

Referring now to FIGS. 1 and 2, there is shown a portion of an optical alignment and exposure system 10, which, except as differently shown and described herein, may be constructed and operated, for example, in the same manner as the first system shown and described in detail in U.S. Pat. No. 3,674,368 mentioned above. This system includes a wafer chuck 12 comprising a cylindrical base member 14 having a central downwardly-extending stem 16 to which a bearing member 18 is secured. Bearing member 18 is in the form of a section of a sphere and is seated in a conically-shaped socket portion 20 of a cylindrical chuck support member 22. This chuck support member is in turn secured to a downwardly extending cylindrical sleeve-like member 24 to form a piston 26, which is coaxially and slidably supported for vertical axial movement upon an upwardly extending cylindrical guide member 28. The vertical axial movement of the piston 26 and, hence, of the wafer-chuck 12 pivotally supported thereon by bearing member 18 and the socket portion 20 of chuck support member 22 is controlled by the application of air pressure to the piston in the same manner as shown and described in U.S. Pat. No. 3,674,368.

Figure 3:
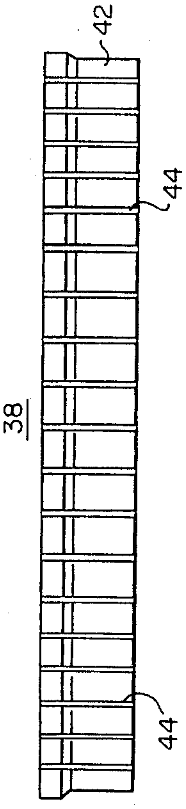
FIG. 3 is a side view of the annular spring member employed in the wafer chuck of FIGS. 1 and 2.

Wafer chuck 12 further comprises a cylindrical vacuum chuck plate 30 coaxially positioned within an annularly recessed central portion 32 of the base member 14 for vertical axial movement therein relative to the upper surface of a peripheral outer portion 34 of the base member; an annular ring 36 press-fit onto the outer periphery of the vacuum chuck plate to define an inclined annular groove 37 therewith at the upper surface of the wafer chuck; and an annular spring member 38 coaxially secured to the base of the vacuum chuck plate and frictionally engaged with the outer peripheral wall of the recessed central portion of the base member to limit the vacuum chuck plate to vertical axial movement within the recessed central portion of the base member and to maintain the vacuum chuck plate in any position to which it is axially moved therein. Annular spring member 38 includes a relatively thick base portion 40 with a thinner outer peripheral portion 42 extending vertically upward therefrom. As shown with the aid of FIG. 3, a plurality of symmetrically spaced flutes 44 extend vertically through the outer peripheral portion 42 and an adjoining part of the base portion 40 of the spring member 38 to provide lateral, but not vertical, spring action.

Wafer chuck 12 also comprises a plurality of symmetrically spaced stop members 46 secured to a bottom peripheral portion of the vacuum chuck plate 30 and slidably engaged with a corresponding bottom peripheral portion of the base member 14 to limit upward vertical movement of the vacuum chuck plate to a normal wafer loading and unloading position at which the upper surfaces of the vacuum chuck plate and the peripheral outer portion 34 of the base member lie in the same plane. Air pressure is supplied through a fitting 50 and an associated conduit 52 in the base member 14 to a region enclosed between the uppermost surface 54 of the recessed central portion of the base member and the lowermost surface 56 of a recessed central portion of the vacuum chuck plate 30 to return the vacuum chuck plate to its normal wafer loading and unloading position from any position to which it may be depressed relative to the upper surface of the peripheral outer portion 34 of the base member. This region is enclosed by a Teflon seal ring 58, which is captivated in a channel formed by an inner peripheral lip portion of the spring member 38 and a notched inner peripheral portion of the vacuum chuck plate 30 and which is urged into air-tight engagement with the inner peripheral wall of the recessed base member 14 by a concentric rubber seal ring 60 captivated in the same channel.

In operation, a semiconductive wafer 62 is loaded onto the vacuum chuck plate 30 of the wafer chuck 12 when the vacuum chuck plate is positioned in its normal wafer loading and unloading position as shown in FIG. 1. The semiconductive wafer 62 is held in place on the vacuum chuck plate 30 by the application of a vacuum to the underside of the semiconductive wafer through a fitting 64, a plurality of interconnected conduits 66 in the vacuum chuck plate, and an associated plurality of apertures 68 in the upper surface of the vacuum chuck plate. A calibrator plate 70 is retractably positioned between the wafer chuck 12 and a mask holder 72 as shown and described in U.S. Pat. No. 3,674,368. This calibrator plate includes a spacing structure 74 and a peripheral reference surface 76 inwardly offset from the lowermost surface of the spacing structure by a selected distance in the range of, for example, .0002 to .002 of an inch.

The wafer chuck 12 is driven upward by the piston 26 to position a marginal portion of the upper surface of the semiconductive wafer 62 in face-to-face abutment with the lowermost surface of the spacing structure 74 of the calibrator plate 70, and to depress the vacuum chuck plate 30 and the semiconductive wafer 62 relative to the upper surface of the peripheral outer portion 34 of the base member 14 until the last-mentioned surface is positioned in face-to-face abutment with the inwardly-offset reference surface 76 of the calibrator plate as shown in FIG. 2. This pivots the wafer chuck 12 as required to align the upper surface of the semiconductive wafer 62 and the upper surface of the peripheral outer portion 34 of the base member 14 in parallel planes spaced the selected distance apart. The wafer chuck 12 is then lowered by the piston 26, the calibrator plate 70 retracted from between the lowered wafer chuck and the mask holder 72, and the wafer chuck driven upward again by the piston to position the upper surface of the peripheral outer portion 34 of the base member 14 in face-to-face abutment with a marginal portion of the lower surface of a photomask 78 held by the mask holder 72. This pivots the wafer chuck as required to align the upper surface of the semiconductive wafer 62 and the lower surface of the photomask 78 in parallel planes spaced the selected distance apart without bringing the semiconductive wafer into contact with the photomask.

Following this parallel plane alignment operation, a vacuum is applied to the bearing member 18 through a fitting 80 in the socket portion 20 of the chuck support member 22 to maintain the parallel-plane alignment achieved. The wafer chuck 12 is then lowered a finite distance by the piston 26 to separate the peripheral outer portion 34 of the base member 14 from the photomask 78 and permit out-of-contact alignment of a pattern on the upper surface of the semiconductive wafer 62 with a pattern on the lower surface of the photomask 78. Upon completion of this pattern-alignment operation, the wafer chuck 12 is again driven upward by the piston 26 to reposition the upper surface of the semiconductive wafer 62 and the lower surface of the photomask 78 in parallel planes spaced the selected distance apart. A photosensitive film on the upper surface of the semiconductive wafer 62 is thereupon exposed through the photomask 78.

Following this exposure operation, the wafer chuck 12 is lowered by the piston 26 to the initial position shown in FIG. 1, the vacuum chuck plate 30 returned to its normal wafer loading and unloading position by the application of air pressure to the fitting 50, and the exposed semiconductive wafer 62 unloaded from the wafer chuck. A nitrogen purge may be effected during any of the above-described operations by the application of nitrogen to the inclined annular groove 37 through a fitting (not shown) and an associated conduit 82.

I claim:

1. Alignment apparatus for use in aligning a workpiece with respect to a mask, said alignment apparatus comprising:

a holder for holding the mask;

a chuck including an outer portion, a recessed central portion, and an inner portion for holding the workpiece, said inner portion of the chuck being supported within the recessed central portion of the chuck for axial movement therein between spaced positions relative to the outer portion of the chuck;

drive means for moving the chuck towards and away from the holder, said chuck being pivotally supported on the drive means; and calibration means for spacing a first surface of the outer portion of the chuck and a first surface of the workpiece held by the inner portion of the chuck a finite distance apart in parallel planes with the first surface of the outer portion of the chuck being positioned closer than the first surface of the workpiece held by the inner portion of the chuck to a first surface of the mask held by the mask holder.

2. Alignment apparatus as in claim 1 wherein:

said outer portion of the chuck includes a peripheral portion of a base member;

said recessed central portion of the chuck includes a recessed central portion of the base member; and said inner portion of the chuck includes a chuck plate supported within the recessed central portion of the base member for vertical axial movement therein relative to the peripheral portion of the base member.

3. Alignment apparatus as in claim 2 wherein said chuck includes restraining means for limiting the chuck plate to vertical axial movement within the recessed central portion of the base member and for maintaining the chuck plate in any position to which it is moved therein.

4. Alignment apparatus as in claim 3 wherein said chuck further includes:

stop means for limiting upward vertical axial movement of the chuck plate to a workpiece loading and unloading position at which the upper surfaces of the chuck plate and the peripheral portion of the base member lie in the same plane; and return means for returning the chuck plate to the workpiece loading and unloading position from any lower position to which it is moved within the recessed central portion of the base member.

5. Alignment apparatus as in claim 4 wherein:

said restraining means comprises a spring member coaxially secured to the chuck plate and frictionally engaged with the base member;

said stop means comprises a plurality of stop members secured to the chuck plate and slidably engaged with the base member; and said return means comprises a conduit communicating with a region enclosed between a lower surface of the chuck plate and an upper surface of the recessed central portion of the base member by a seal ring.

6. Alignment apparatus as in claim 5 wherein said calibration means comprises a calibrator plate retractably supported between the chuck and the holder, said calibrator plate including a spacing structure and an offset reference surface arranged for face-to-face abutment with a marginal portion of the upper surface of the workpiece held by the chuck plate and with the upper surface of the peripheral portion of the base member, respectively, to space the two last-mentioned surfaces a finite distance apart in parallel planes with the upper surface of the peripheral portion of the base member being positioned closer than the upper surface of the workpiece held by the chuck plate to a lower surface of the mask held by the mask holder.

7. A workpiece chuck comprising:

a pivotally supported base member having a peripheral portion and a recessed central portion; and a chuck plate for holding a workpiece, said chuck plate being supported within the recessed central portion of the base member for vertical axial movement therein between spaced positions relative to the peripheral portion of the base member.

8. A workpiece chuck as in claim 7 wherein said chuck includes restraining means for limiting the chuck plate to vertical axial movement within the recessed central portion of the base member and for maintaining the chuck plate in any position to which it is moved therein.

9. Alignment apparatus as in claim 8 wherein said chuck further includes:

stop means for limiting upward vertical axial movement of the chuck plate to a workpiece loading and unloading position at which the upper surfaces of the chuck plate and the peripheral portion of the base member lie in the same plane; and return means for returning the chuck plate to the workpiece loading and unloading position from any lower position to which it is moved within the recessed central portion of the base member.

10. Alignment apparatus as in claim 9 wherein:

said restraining means comprises a spring member coaxially secured to the chuck plate and frictionally engaged with the base member;

said stop means comprises a plurality of stop members secured to the chuck plate and slidably engaged with the base member; and said return means comprises a conduit communicating with a region enclosed betwen a lower surface of the chuck plate and an upper surface of the recessed central portion of the base member by a seal ring.

* * * * *